United States Patent
Uglow et al.

(10) Patent No.: US 7,060,605 B2
(45) Date of Patent: Jun. 13, 2006

(54) METHODS FOR MAKING DUAL-DAMASCENE DIELECTRIC STRUCTURES

(75) Inventors: Jay E. Uglow, Livermore, CA (US); Nicolas J. Bright, San Jose, CA (US); Dave J. Hemker, San Jose, CA (US); Kenneth P. MacWilliams, Monte Sereno, CA (US); Jeffrey C. Benzing, Saratoga, CA (US); Timothy M. Archer, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/785,999

(22) Filed: Feb. 16, 2001

(65) Prior Publication Data

US 2001/0009803 A1 Jul. 26, 2001

Related U.S. Application Data

(63) Continuation of application No. 09/346,156, filed on Jun. 30, 1999, now Pat. No. 6,251,770.

(51) Int. Cl.
*H01L 21/4763* (2006.01)
(52) U.S. Cl. .................................... 438/624
(58) Field of Classification Search ............... 438/642, 438/622–624, 627, 687, 637–640; 257/785–760, 257/773–775
See application file for complete search history.

(56) References Cited

U.S. PATENT DOCUMENTS

| 5,635,423 A | 6/1997 | Huang et al. ................ 437/195 |
| 5,705,430 A | 1/1998 | Avanzino et al. ............ 438/195 |
| 5,821,168 A | 10/1998 | Jain .......................... 438/692 |
| 5,858,869 A | 1/1999 | Chen et al. |
| 5,904,565 A | 5/1999 | Nguyen et al. .............. 438/687 |
| 5,960,320 A | 9/1999 | Park ........................... 438/688 |
| 5,969,422 A | 10/1999 | Ting et al. ................... 257/762 |
| 5,989,623 A * | 11/1999 | Chen et al. .................... 427/97 |
| 6,025,273 A | 2/2000 | Chen et al. |

(Continued)

FOREIGN PATENT DOCUMENTS

DE     19904311     8/1999

(Continued)

OTHER PUBLICATIONS

Wolf, et al. Silicon Processing for the VLSI Era, vol. 2-Process Integration, Lattice Press: Sunset Beach CA, 1990, pp. 194.*

(Continued)

*Primary Examiner*—Carl Whitehead, Jr.
*Assistant Examiner*—Jennifer M. Dolan
(74) *Attorney, Agent, or Firm*—Martine Penilla & Gencarella, LLP (57) ABSTRACT

A dielectric structure and method for making a dielectric structure for dual-damascene applications over a substrate are provided. The method includes forming a barrier layer over the substrate, forming an inorganic dielectric layer over the barrier layer, and forming a low dielectric constant layer over the inorganic dielectric layer. In this preferred example, the method also includes forming a trench in the low dielectric constant layer using a first etch chemistry, and forming a via in the inorganic dielectric layer using a second etch chemistry, such that the via is within the trench. In another specific example, the inorganic dielectric layer can be an un-doped TEOS oxide or a fluorine doped oxide, and the low dielectric constant layer can be a carbon doped oxide (C-oxide) or other low K dielectrics.

10 Claims, 7 Drawing Sheets

U.S. PATENT DOCUMENTS

| | | | |
|---|---|---|---|
| 6,043,167 A * | 3/2000 | Lee et al. | 438/789 |
| 6,054,379 A | 4/2000 | Yau et al. | |
| 6,069,058 A | 5/2000 | Hong | |
| 6,077,574 A * | 6/2000 | Usami | 427/579 |
| 6,110,648 A * | 8/2000 | Jang | 430/312 |
| 6,165,898 A | 12/2000 | Jang et al. | |
| 6,187,663 B1 * | 2/2001 | Yu et al. | 438/624 |
| 6,197,696 B1 * | 3/2001 | Aoi | 438/700 |
| 6,207,577 B1 * | 3/2001 | Wang et al. | 438/706 |
| 6,211,063 B1 | 4/2001 | Liu et al. | |
| 6,225,207 B1 * | 5/2001 | Parikh | 438/622 |
| 6,255,735 B1 * | 7/2001 | Wang et al. | 257/774 |
| 6,277,733 B1 * | 8/2001 | Smith | 438/636 |
| 6,287,955 B1 | 9/2001 | Wang et al. | |
| 6,297,163 B1 | 10/2001 | Zhu et al. | |
| 6,340,435 B1 * | 1/2002 | Bjorkman et al. | 216/72 |
| 6,410,394 B1 * | 6/2002 | Shao et al. | 438/217 |
| 6,413,583 B1 * | 7/2002 | Moghadam et al. | 427/249.15 |
| 2002/0054962 A1 | 5/2002 | Huang | |

FOREIGN PATENT DOCUMENTS

| | | |
|---|---|---|
| EP | 0834916 | 4/1998 |
| EP | 0945900 A1 | 3/1999 |
| WO | 00/10202 | 2/2000 |

OTHER PUBLICATIONS

Wolf et al., "*Silicon Processing for the VLSI Era* vol. 1: *Process Technology*," Lattice Press, 1986, pp. 194.

* cited by examiner

METHODS FOR MAKING DUAL-DAMASCENE DIELECTRIC STRUCTURES

This is a Continuation application of prior application Ser. No. 09/346,156 filed on Jun. 30, 1999, now U.S. Pat. No. 6,251,770.

BACKGROUND OF THE INVENTION

1. Field of the Invention

This invention relates generally to dielectric structures, and more particularly to dielectric structures for dual-damascene applications.

2. Description of the Related Art

Semiconductor devices are made from multi-layer structures that are fabricated on semiconductor wafers. Of great importance to the multi-layer structures is the dielectric materials used in between metallization interconnect lines. In dual-damascene applications, the metallization interconnect lines are defined in trenches that are etched into dielectric layers. Typically, the interconnect metallization is a copper (Cu) material, and the conductive vias are also integrally formed of Cu. As is known to those skilled in the art, there are three general techniques for fabricating metallization interconnect lines and conductive vias. The techniques include: (i) a via first fabrication; (ii) self-aligned fabrication; and (iii) trench first fabrication.

As the demand for faster device speeds continue to increase, fabrication and design engineers have been implementing lower dielectric constant materials. Typically, the speed of an interconnect structure is characterized in terms of RC (resistance/capacitance) delays. Lower dielectric constant materials help in reducing inter-metal capacitance, and therefore, results in reduced delays and faster devices.

The move toward lower dielectric materials has included the use of both organic as well as inorganic materials. One type of lower dielectric material includes a carbon doped silicon dioxide (C-oxide). C-oxide typically has a dielectric constant of about 3.0 or lower, compared to dielectric constants of about 4.1 for silicon dioxides (e.g., un-doped TEOS). Although lower dielectric constants are achieved using C-oxide, this type of inorganic material poses etching difficulties. These difficulties are primarily due to the fact that C-oxide is partially organic (i.e., due to the carbon) and partially inorganic (i.e., silicon dioxide). Also, etch chemistries are generally optimized for inorganic only or organic only films.

Figure 1:
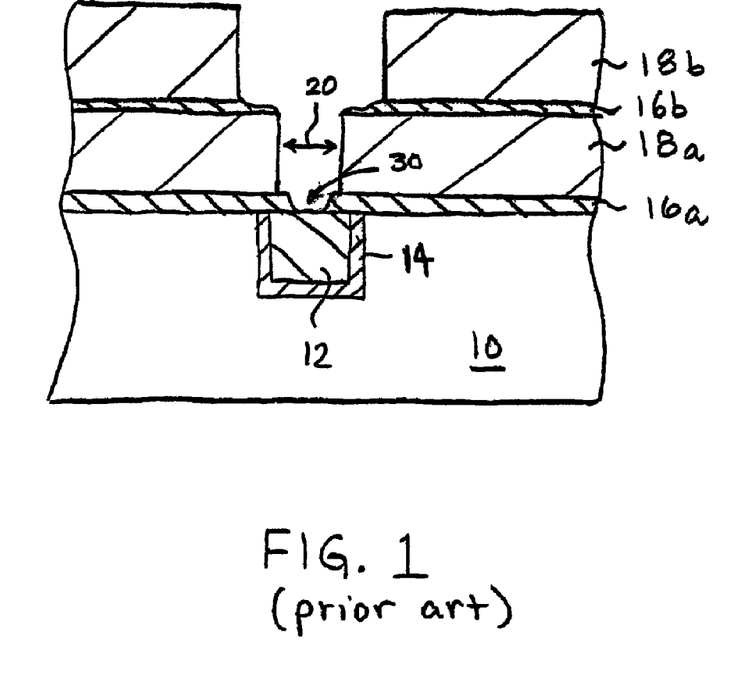
FIG. 1 shows a cross-sectional view of a dielectric structure having a partially removed barrier layer.

To further describe these difficulties, reference is now made to FIG. 1. As shown, a dielectric 10 is shown having a copper trench line 12 with a liner barrier 14. A barrier layer 16a is used to prevent copper from diffusing into the dielectric 10. A first oxide layer 18a is deposited over the barrier layer 16a, and a trench stopping layer 16b is deposited over the first oxide layer 18a. A second oxide layer 18b is then deposited over the trench stopping layer 16b. In cases where the first and second oxide layers 18a and 18b are un-doped TEOS oxide or fluorine doped oxides, there are well developed etching techniques that provide excellent selectivities to the layers 16a and 16b. For example, such selectivities are in the range of about 20:1, which therefore enable the thicknesses of the layers 16a and 16b to be kept at a minimum. This is important because layers 16, which are typically made of silicon nitride (SiN) or silicon carbide (SiC) have dielectric constant levels as high as about 9. Selectivities in the 20:1 range therefore prevent the barrier layer 16a from being prematurely removed when relatively thin layers are formed.

On the other hand, when lower dielectrics such as C-oxide are implemented for oxide layers 18a and 18b, the selectivity to the barrier layers 16 is reduced to ranges nearing about 5:1. This reduction in selectivity therefore causes the barrier layer 16a to be removed at location 30, thereby exposing the underlying copper line 12 to oxygen. When this happens, increased oxidation of the exposed copper will occur (during ashing operations and the like), which therefore generates higher resistive contacts through via holes 20. Even though the barrier layer 16a will be removed prior to sputtering with a liner barrier, the premature exposure does increase the degree of oxidation. In addition, once the copper is exposed, an amount of copper can be etched and possibly caused to be deposited into the dielectric walls of the via holes 20. Obviously, if copper material were to be deposited into the inter-metal dielectric, a device may fail to optimally perform in accordance with desired performance specifications.

In view of the foregoing, there is a need for low K dielectric materials for use in dual-damascene applications that etch well and retain high selectivity to copper barrier layer materials.

SUMMARY OF THE INVENTION

Broadly speaking, the present invention fills these needs by providing inter-metal dielectric structures having improved performance in dual-damascene applications. It should be appreciated that the present invention can be implemented in numerous ways, including as a process, an apparatus, a system, a device, or a method. Several inventive embodiments of the present invention are described below.

In one embodiment, a method for making a dielectric structure for dual-damascene applications over a substrate is disclosed. The method includes forming a barrier layer over the substrate, forming an inorganic dielectric layer over the barrier layer, and forming a low dielectric constant layer over the inorganic dielectric layer. In this preferred embodiment, the method also includes forming a trench in the low dielectric constant layer using a first etch chemistry, and forming a via in the inorganic dielectric layer using a second etch chemistry, wherein the via is within the trench. In one specific example, the inorganic dielectric layer can be an un-doped PECVD TEOS oxide or a fluorine doped oxide, and the low dielectric constant layer can be a carbon doped oxide or other low K dielectric materials.

In another embodiment, a method for making a multi-layer inter-metal dielectric over a substrate is disclosed. The method includes: (a) forming a barrier layer over the substrate; (b) forming a silicon dioxide layer over the barrier layer; (c) forming a low K dielectric layer over the silicon dioxide layer; (d) forming a trench through the low K dielectric layer; and (e) forming a via in the trench extending to the barrier layer. The forming of the trench is performed using a first etch chemistry and the forming of the via is performed using a second chemistry that is highly selective to the barrier layer and optimized to etch through the silicon dioxide layer.

In yet a further embodiment, a method of making a dielectric layer for use in dual-damascene applications is disclosed. The method includes providing a substrate, depositing a barrier layer over the substrate, and depositing a dopant varying oxide layer over the barrier layer. The depositing of the dopant varying oxide layer includes: (a) depositing in a chemical vapor deposition chamber an initial amount of un-doped oxide over the barrier layer; and (b) introducing an increasing amount of carbon into the chemical vapor deposition chamber, such that a topmost portion of the dopant varying oxide layer has a lower dielectric constant than the initial amount of un-doped oxide.

In still another embodiment, a multi-layer dielectric layer over a substrate for use in dual-damascene applications is disclosed. The multi-layer dielectric layer includes: (a) a barrier layer that is disposed over the substrate; (b) an inorganic dielectric layer that is disposed over the barrier layer; and (c) a low dielectric constant layer that is disposed over the inorganic dielectric layer. The inorganic dielectric layer is configured to receive metallization line trenches and the low dielectric constant layer is configured to receive vias during a dual-damascene process.

Advantageously, the ability to achieve high selectivity to the barrier layer during the via etch will allow the barrier layer thickness to be decreased, thus lowering the overall inter-layer capacitance. Further, the ability to achieve this selectivity during the via etch will also improve line depth uniformity control. Furthermore, manufacturing costs will be lowered and throughput increased as the barrier layer, the via dielectric and the trench dielectric materials are deposited by way of one deposition platform. By way of example, a single deposition chamber can be used to deposit multiple layers or layers having varying profiles in their dielectric constant. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for inter-metal dielectric structures and methods of making inter-metal dielectric structures having improved performance in dual-damascene applications. It will be obvious, however, to one skilled in the art, that the present invention may be practiced without some or all of these specific details. In other instances, well known process operations have not been described in detail in order not to unnecessarily obscure the present invention.

In the embodiments of the present invention, a dual-damascene technique is used to define metallization lines and conductive vias in dielectric layers. As mentioned above, three dual-damascene techniques are typically used for defining a trench and via. These techniques include: (i) via first fabrication; (ii) self-aligned fabrication; and (iii) trench first fabrication. In the following illustrations, emphasis will be placed on trench first fabrication, however, the benefits of and advantages of the present invention should be understood to extend to all dual-damascene fabrication techniques.

Figure 2:
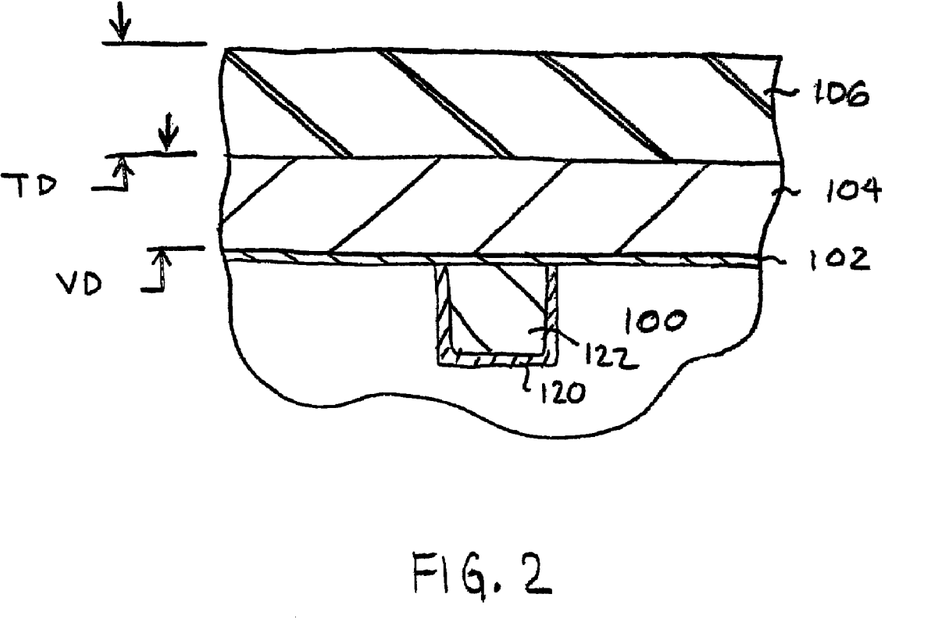
FIG. 2 illustrates a cut-out of a semiconductor structure having a plurality of fabricated layers, in accordance with one embodiment of the present invention.

FIG. 2 illustrates a cut-out of a semiconductor structure having a plurality of fabricated layers, in accordance with one embodiment of the present invention. The structure has an oxide layer 100, which was previously fabricated to form a metallization line therein. The metallization line is typically fabricated by etching a trench into the oxide 100 and then filling the trench with conductive material. The conductive material is preferably a copper material 122.

In the trench, a barrier layer 120 is preferably sputtered to prevent the copper material 122 from diffusing into the oxide 100. In a preferred embodiment, the barrier layer 120 is tantalum nitride (TaN). Of course, other barrier layer materials can also be used. The barrier layer 120 will thus line the walls of the trench and interface with the copper material 122. After a chemical mechanical polishing operation (CMP) is performed to remove the barrier layer 120 and the excess copper material 122 from over the oxide 100, a copper metallization line will be formed. Once the appropriate number of metallization lines and vias (not shown) have been formed in the oxide 100, a barrier layer 102 is deposited to protect the copper material 122 from premature oxidation when via holes are etched through overlying dielectric materials to the barrier layer 102. The barrier layer 102 is also configured to function as a selective etch stop. In this embodiment, the barrier layer 102 is preferably silicon nitride (SiN) or silicon carbide (SiC).

Once the barrier layer 102 has been properly deposited, a via dielectric layer 104 is deposited to a thickness that is approximately the desired depth of a subsequently formed via hole. In a particular example, the via dielectric layer 104 may have a via dielectric (VD) thickness that ranges between about 4000 angstroms and about 5000 angstroms, and is most preferably about 4500 angstroms. The via dielectric layer 104 is preferably made from a dielectric material that when etched, is very selective to the barrier layer 102.

By way of example, the via dielectric layer 104 is preferably an inorganic silicon dioxide. Example silicon dioxides can include, a PECVD un-doped TEOS silicon dioxide, a PECVD fluorinated silica glass (FSG), HDP FSG, etc. and the like. Once the via dielectric layer 104 has been deposited to the desired thickness, a trench dielectric layer 106 is deposited to a suitable thickness that approximates the depth of a subsequently etched trench (i.e., for defining metallization lines). Preferably, the trench dielectric (TD) layer has a thickness ranging between about 4000 angstroms and about 6000 angstroms, and most preferably is about 5000 angstroms.

It is now important to note that the material properties of the trench dielectric layer 106 are different than that of via dielectric layer 104. In a preferred embodiment of the present invention, the trench dielectric layer 106 is a low K dielectric material. In general, the dielectric constant of the trench dielectric layer 106 is below about 3, while the dielectric constant of the via dielectric layer 104 is about 4. It should be understood that any number of low K dielectric materials can be used for the trench dielectric layer 106, such as, organic dielectric materials and inorganic dielectric materials. In a most preferred embodiment, the trench dielectric layer 106 is preferably carbon doped oxide (C-oxide). C-oxide is considered an inorganic dielectric, although, C-oxide is actually part inorganic and part organic. Typically, the dielectric constant of C-oxide can be about 3.0 or lower.

Figure 3:
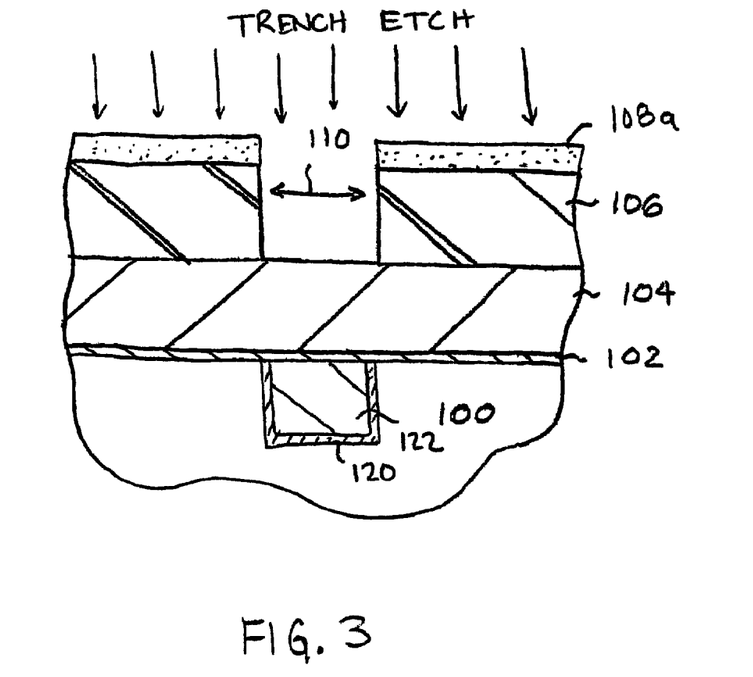
FIG. 3 illustrates a trench defined in the trench dielectric down to the via dielectric, in accordance with one embodiment of the present invention.

Once the structure of FIG. 2 is complete, a photoresist layer 108a (see FIG. 3) is spin-coated over the top surface of the trench dielectric layer 106. The photoresist 108a is then patterned using a suitable photolithography technique to define the appropriate patterns for the subsequently etched trenches in the trench dielectric 106. As shown in FIG. 3, a trench 110 is etched into the trench dielectric 106 down to the via dielectric 104. The trench etch is preferably performed using etching chemistries that are well configured to etch through low K dielectric materials, such as the C-oxide. A preferred etch chemistry to etch through the trench dielectric 106 is Ar/O2/CF4. Other example chemistries can include, Ar/CO/CF4/C4F8, Ar/O2/C4F8, N2/O2/C2H2F4, N2/O2/C2H4, H2/CF4/Ar, and Cl2/O2. The trench etch can be a timed process, which is configured to stop when substantially all of the trench dielectric layer in the trench 110 is removed. An example etch rate for C-oxide using Ar/O2/CF4 can be about 10,000 angstroms/minute. It should also be noted that, no trench barrier layer (e.g., like 16b) is used in the structure of the present invention in an effort to further decrease the dielectric constant of the dielectric material.

Although the selectivity to the barrier layer 102 is not very good for etching chemistries implemented to etch through the low K dielectric of the trench dielectric layer 106, a different etch chemistry is used to etch through the via dielectric 104. Thus, once the trench 110 has been defined through the trench dielectric layer 106, a via hole photoresist mask 108b (see FIG. 4) is defined over the trench dielectric 106 and within the trench 110 to define the locations of desired via holes.

Figure 4:
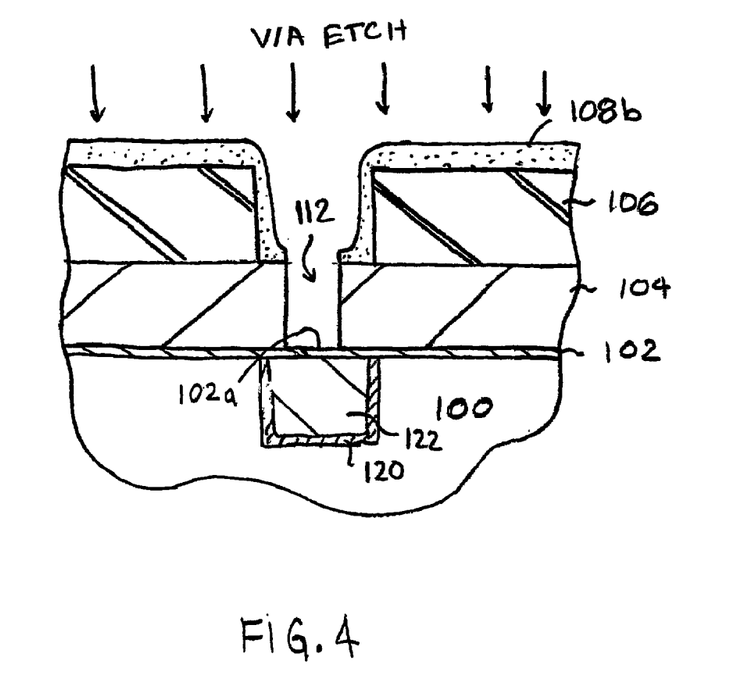
FIGS. 4 and 5 illustrate a via defined in the via dielectric down to the barrier layer, in accordance with one embodiment of the present invention.

After the via hole photoresist mask 108b is properly defined, an etching operation is performed to etch through the via dielectric layer 104 using a chemistry that as shown in FIG. 4 is optimized to etch through inorganic oxide materials. Any standard inorganic oxide material can be used for the via dielectric layer 104. Example oxides include un-doped TEOS silicon dioxide, and fluorine doped oxides. The chemistry implemented to etch through these common silicon dioxide materials should have very good selectivities to the barrier layer, which is typically silicon nitride (SiN) or silicon carbide (SiC). One example chemistry for etching through the via dielectric can be C4F8/CO/Ar/O2. Using this exemplary chemistry, selectivities to the barrier layer 102 can range up to about 20:1, thereby preventing inadvertent removal of the barrier layer 102. Thus, the via etching operation that is used to define the via hole 112 through the via dielectric layer 104 is well configured to substantially stop at and expose a barrier layer region 102a.

Figure 5:
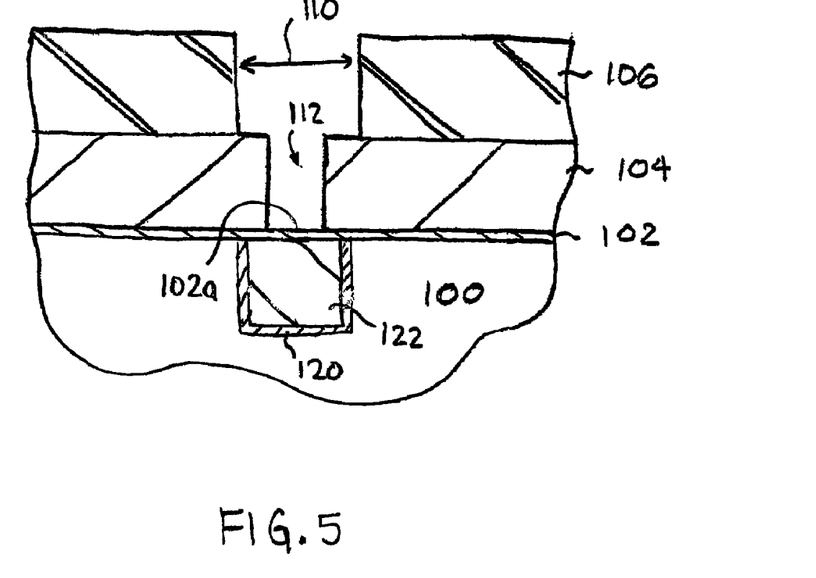
Figure 6:
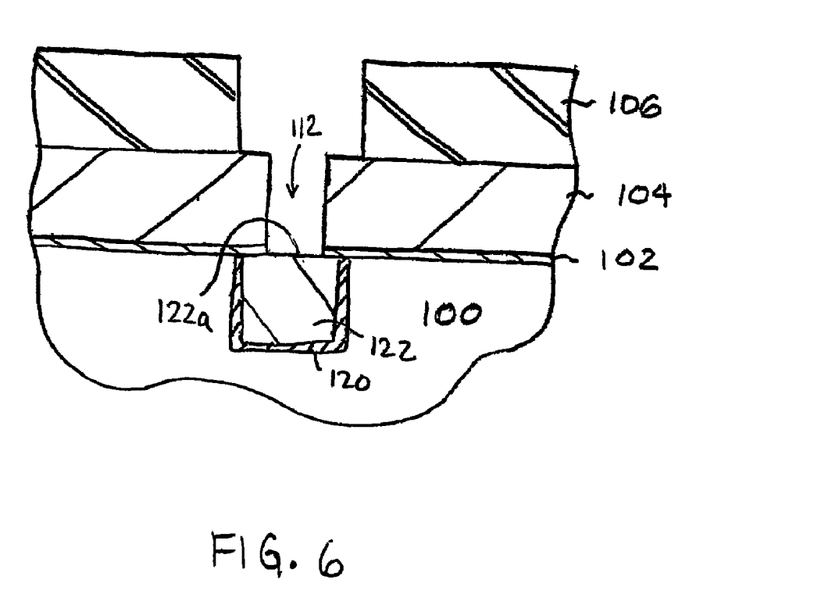
FIG. 6 illustrates the structure of FIG. 5 after the barrier layer region is removed from within the via hole, in accordance with one embodiment of the present invention.

At the time the fabrication proceeds to the sputtering of a barrier layer within the surfaces of the trench regions and the via holes, the barrier layer 102a is removed as shown in FIG. 6. By removing the barrier layer 102a, the copper material 122 will be exposed and may therefore form an oxidized layer of copper where exposed. However, the amount of copper oxide (CuOx) formed over the copper material 122 will be minimal and controlled during the fabrication of the via holes. In fact, the barrier layer 102a may not be removed until after an ashing operation is performed to remove the photoresist as shown in FIG. 5, the walls of the trench regions 110 and the via holes 112 are then coated with a barrier layer 300, which is preferably a tantalum nitride (TaN) material, or a tantalum (Ta) material.

Figure 10A:
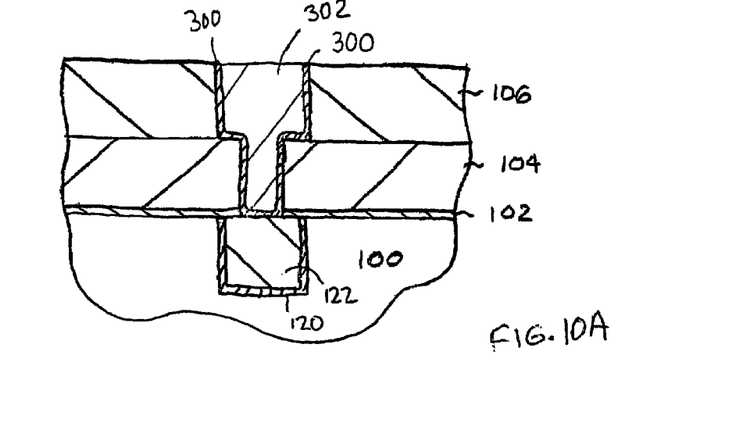
FIGS. 10A–10C illustrate copper filled via and trench structures, in accordance with one embodiment of the present invention.

After the barrier layer 300 is formed, a copper material is formed within the via holes 112 and the trenches 110 to define the copper material 302 that make the conductive contacts and metallization lines. In the example of FIG. 10A, it is assumed that a copper chemical mechanical polishing (CMP) operation was performed to remove the barrier layer material 300 and the copper material from over the surface of the trench dielectric layer 106.

Figure 7:
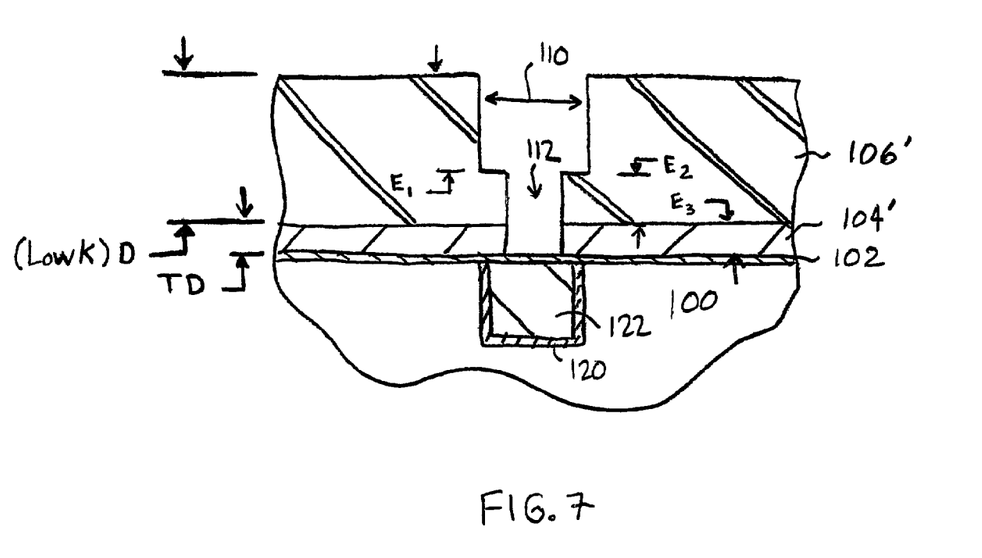
FIG. 7 illustrates another embodiment of the present invention, in which the low-K dielectric layer is thicker than the inorganic dielectric layer.

Referring now to FIG. 7, another embodiment of the present invention is disclosed. In this embodiment, the inorganic dielectric material 104' is deposited to a reduced thickness and a lower K dielectric material 106' is deposited to an increased thickness, relative to the embodiment of FIG. 2.

By way of example, the dielectric material 104' can be a TEOS dielectric material, a fluorine doped dielectric material, or other dielectrics having excellent etch selectivities to the barrier layer 102. The lower K dielectric material 106' can be any suitable low K dielectric material, such as, an organic or inorganic low K dielectric material. Preferably, the lower K dielectric material 106' is C-oxide. In this embodiment, the trench 110 is first etched $E_1$ using a first etch chemistry that is optimized to etch the lower K dielectric material 106'. As described above, one exemplary chemistry is Ar/O2/CF4. The trench depth is preferably calculated using a timing technique which determines when the etching operation should stop.

Now that the trenches 110 have been etched throughout an integrated circuit device, a photoresist mask (not shown) is used to define the locations of the via holes 112 which are partially etched $E_2$ using the same etch chemistry that is optimized to etch through the lower K dielectric material 106'. This etch $E_2$ preferably stops at about the interface of the dielectric material 104'. Once the via hole has been partially defined through the lower K dielectric material 106', a third etch $E_3$ is used to etch through the dielectric material 104'.

Figure 10B:
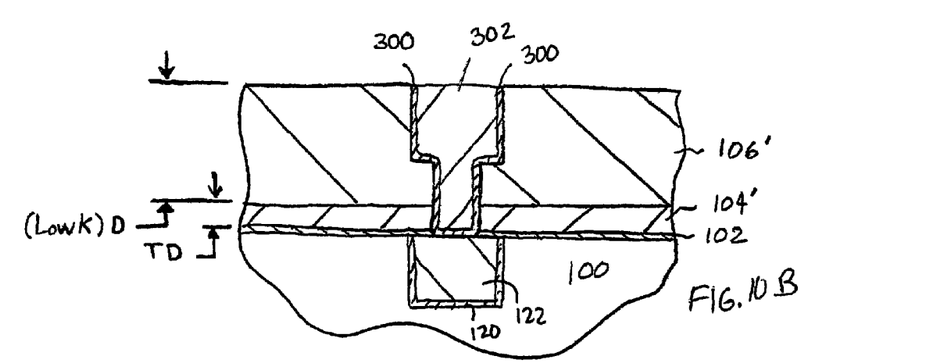

The etching chemistry of the third etch is preferably well configured to have high selectivity to the barrier layer 102. The etch operation will therefore stop at the barrier layer 102 without exposing the copper material 122 in the metallization line of the oxide 100. The barrier layer 102 is then removed just before the barrier layer 300 is formed on the inner surfaces of the trench regions 110 and the via holes 112 as shown in FIG. 10B. The trench regions and the via holes are then filled with a copper material and then a CMP operation is performed to remove the excess conductive material from over the lower K dielectric material 106'. Also shown in FIG. 10B is that substantially more lower K dielectric layer 106' "(low K) D" is implemented that the trench dielectric "TD". In one embodiment, it is preferred that at least about 1,000 angstroms of TD remain over the barrier layer 102. The typical thickness of both the (low K) D and TD layers is about 10,000 angstroms. Of course, this is only an exemplary thickness and it will change from design-to-design.

Figure 8A:
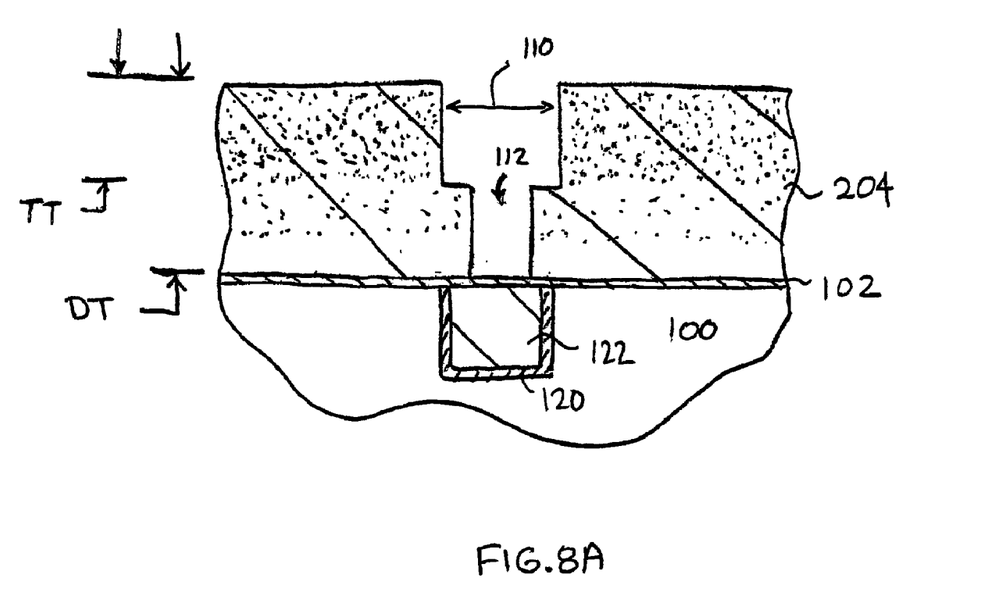
FIG. 8A illustrates yet another embodiment of the present invention, in which a dopant varying oxide layer is deposed over a barrier layer, in accordance with one embodiment of the present invention.
Figure 8B:
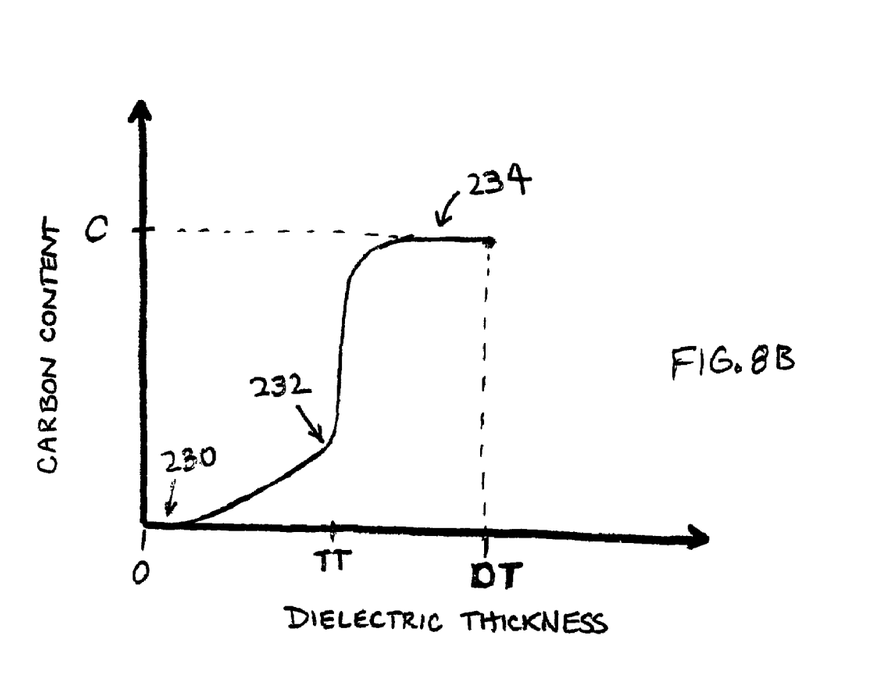
FIG. 8B is a graph that generally shows the amount of carbon dopant that can be introduced over the increasing thickness of the dopant varying oxide, in accordance with one embodiment of the present invention.

FIG. 8A shows yet another embodiment of the present invention, in which a chemical vapor deposited dielectric layer 204 is formed over the barrier layer 102. As shown in FIG. 8B, the chemical vapor deposited dielectric material 204 will have a varying profile of carbon. In general, substantially no carbon is provided at a point 230 when the deposition begins. When the deposited material grows to a thickness (TT) that will provide for a subsequently etched via hole, the carbon content at a point 232 will start to increase to a level "C." Level C is generally the amount of carbon that is introduced into a CVD chamber to produce C-oxide having a dielectric constant that is less than about 3, and preferably about 2.7.

In this preferred embodiment, as the thickness of the dielectric layer 204 increases, (as more dielectric material is deposited), carbon is introduced into the deposition chamber such that the deposited material will have more carbon content as a greater thickness is formed. By way of example, FIG. 8B illustrates a graph in which the carbon content is plotted against the dielectric thickness of the chemical vapor deposited dielectric 204 of FIG. 8A. As shown, initially the carbon content will be substantially zero and the dielectric material will be generally all inorganic $SiO_2$.

As more dielectric material is deposited in the chemical vapor deposition chamber, the carbon content is ramped up to about a full carbon content amount at a trench thickness (TT). The trench thickness is illustrated in FIG. 8A as being the depth of the trench 110 that will subsequently be etched into the dielectric layer 204. Once above the trench thickness, the carbon content is increased to a level that is configured to make the topmost portion of the dielectric 204 a low K dielectric material having a dielectric constant of below about 3. Accordingly, the etching of the trenches and the via holes through the dielectric material 204 will be performed in a two-step process. The first step will include etching through the topmost portion of the dielectric layer 204 with an etch chemistry that is optimized to etch the carbon doped oxide (C-oxide). The etching is preferably performed using a timed etch that is configured to determine when the appropriate trench thickness depth has been achieved.

In a next step, the via hole 212 can be etched through the dielectric layer 204, which is substantially less doped as the dielectric material approaches the barrier layer 102. In a preferred embodiment, the etching chemistry implemented to etch the via hole will be configured to etch typical inorganic dielectrics and thus have very good selectivity to the barrier layer 102. By way of example, the selectivity can be about 20:1, thus preserving the integrity of the barrier layer 102. This also allows thinner barrier layers 102 to be used, thus lowering the dielectric constant.

Figure 10C:
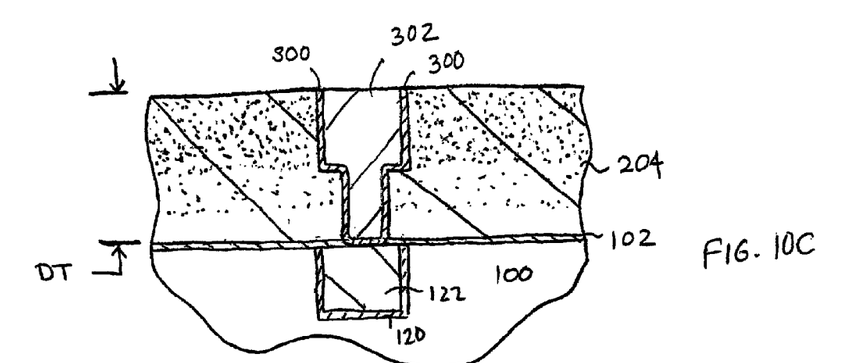

FIG. 10C illustrates a dual-damascene via and trench structure, after a barrier layer 300 and a copper metallization 302 have been deposited, in accordance with one embodiment of the present invention. When the time comes to remove the barrier layer region 102a from within the via holes 112, substantially less copper oxidation will occur, since this removal does not occur until after many of the operations (e.g., ashing) that could have caused high oxidation were performed. In this embodiment, the dielectric thickness "DT" can range from design-to-design, however, a typical thickness is about 10,000 angstroms.

Figure 9:
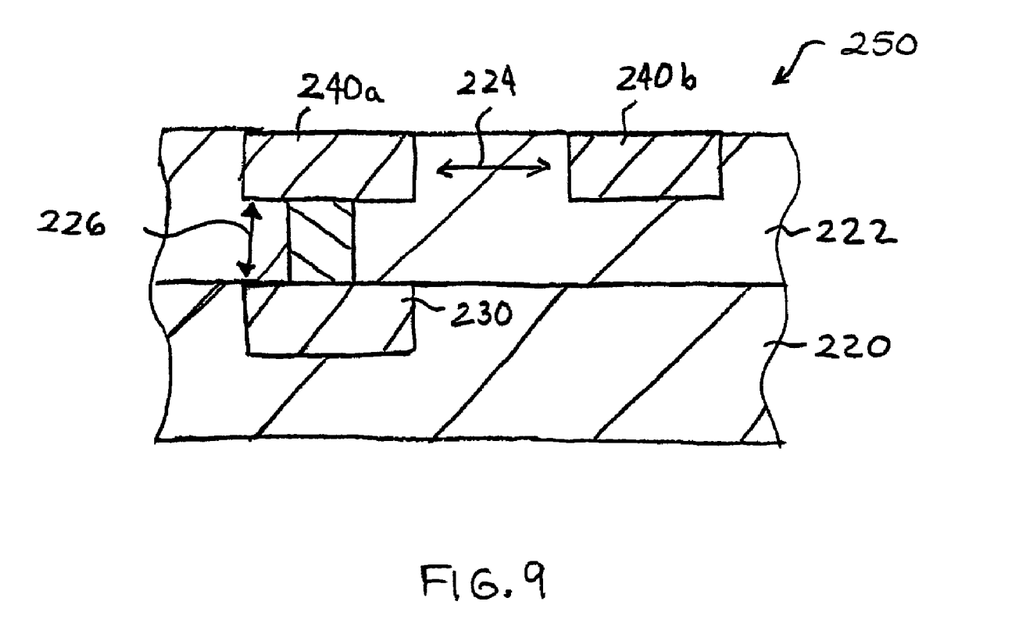
FIG. 9 illustrates a semiconductor structure having multiple metal layers.

Reference is now drawn to FIG. 9, which illustrates a semiconductor structure 250, in accordance with one embodiment of the present invention. This structure is provided to pictorially point-out where devices benefit most by having low K inter-metal dielectrics. In general, a region 224 between metal lines 240a and 240b will contribute most to speed decreasing RC delays than a region 226 between metal lines 240a and 230. As discussed above with reference to the various embodiments, the upper most part of an inter-metal dielectric (i.e., the trench region) is low-K. Therefore, a device having lower most parts (i.e., the via region) of an inter-metal dielectric as basic inorganic $SiO_2$ will generally not increase speed obstructing RC delays.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A method for making a dielectric structure for dual-damascene applications, the method comprising:
    (a) providing a substrate;
    (b) fabricating first metallization lines in the substrate;
    (c) forming a barrier layer over the first metallization lines and the substrate; and
    (d) forming an inter-metal dielectric structure, the forming of the inter-metal dielectric structure,
    consisting the sequential steps of:
        (d)(i) forming an inorganic dielectric layer to define a via dielectric layer directly over the barrier layer, the inorganic dielectric layer being highly selective relative to the barrier layer when etched;
        (d)(ii) forming a carbon doped oxide layer to define a trench dielectric layer that is defined directly over and in direct contact with the inorganic dielectric layer, the trench layer being formed to define a metallization line layer of the inter-metal dielectric structure;
        (d)(iii) forming a trench in the carbon doped oxide layer using a first etch chemistry to etch the carbon doped oxide layer; and
        (d)(iv) forming a via in the inorganic dielectric layer from within the trench using a second etch chemistry to etch the inorganic dielectric layer, the second etch chemistry being different than the first etch chemistry.

2. A method for making a dielectric structure for dual-damascene applications as recited in claim 1, wherein the barrier layer is one of a silicon nitride layer and a silicon carbide layer.

3. A method for making a dielectric structure for dual-damascene applications as recited in claim 1, wherein the inorganic dielectric layer is a TEOS silicon dioxide material.

4. A method for making a dielectric structure for dual-damascene applications as recited in claim 1, wherein the carbon doped oxide layer is a low dielectric constant layer having a dielectric constant of about and no greater than 3.0.

5. A method for making a dielectric structure for dual-damascene applications as recited in claim 1, wherein the inorganic dielectric layer is one of a TEOS oxide layer and a fluorine doped oxide layer.

6. A method for making a dielectric structure for dual-damascene applications as recited in claim 5, wherein the first etch chemistry is optimized to etch through the carbon doped oxide layer and the second etch chemistry is optimized to etch through one of the TEOS oxide layer and the fluorine doped oxide layer.

7. A method for making a dielectric structure for dual-damascene applications as recited in claim 6, wherein the second etch chemistry is selective to the barrier layer.

8. A method for making a dielectric structure for dual-damascene applications as recited in claim 1, wherein the inorganic dielectric layer has a thickness between about 0.4 microns ($\mu$) and 0.5 microns.

9. A method for making a dielectric structure for dual-damascene applications as recited in claim 1, wherein the carbon doped oxide layer has a thickness between about 0.5 microns and 0.6 microns.

10. A method for making a dielectric structure for dual-damascene applications as recited in claim 1, wherein the inorganic dielectric layer has a dielectric constant of about 4.

* * * * *

UNITED STATES PATENT AND TRADEMARK OFFICE
CERTIFICATE OF CORRECTION

PATENT NO. : 7,060,605 B2 Page 1 of 1
APPLICATION NO. : 09/785999
DATED : June 13, 2006
INVENTOR(S) : Uglow et al.

It is certified that error appears in the above-identified patent and that said Letters Patent is hereby corrected as shown below:

Page 1, Item (73), add Assignee -- Novellus Systems, Inc., San Jose, California -- after Lam Research Corporation, Fremont, California.

Signed and Sealed this

Twenty-eighth Day of November, 2006

JON W. DUDAS
*Director of the United States Patent and Trademark Office*